United States Patent
Chung et al.

(10) Patent No.: US 7,598,728 B2
(45) Date of Patent: Oct. 6, 2009

(54) SYSTEM AND METHOD FOR UTILIZING AN AUTOMATIC CIRCUIT TESTER SYSTEM HAVING MULTIPLE AUTOMATIC CIRCUIT TESTER PLATFORMS

(75) Inventors: Suckheui Chung, 103 9th St., #114, Charlestown, MA (US) 02129; Byeongseo Yook, Brookline, MA (US)

(73) Assignee: Suckheui Chung, Charlestown, MA (US)

( * ) Notice: Subject to any disclaimer, the term of this patent is extended or adjusted under 35 U.S.C. 154(b) by 391 days.

(21) Appl. No.: 11/561,000

(22) Filed: Nov. 17, 2006

(65) Prior Publication Data
US 2008/0030203 A1 Feb. 7, 2008

Related U.S. Application Data

(60) Provisional application No. 60/835,790, filed on Aug. 4, 2006.

(51) Int. Cl.
*G01R 31/02* (2006.01)
*G01R 31/28* (2006.01)
(52) U.S. Cl. .................... 324/158.1; 324/765
(58) Field of Classification Search ............. 324/158.1, 324/765
See application file for complete search history.

(56) References Cited

U.S. PATENT DOCUMENTS

| 6,040,691 | A | 3/2000 | Hanners et al. |
| 6,476,628 | B1 * | 11/2002 | LeColst ............... 324/765 |
| 6,583,639 | B1 * | 6/2003 | Vogley ............... 324/765 |
| 7,385,385 | B2 * | 6/2008 | Magliocco et al. ....... 324/158.1 |
| 2003/0062888 | A1 | 4/2003 | Magliocco et al. |

* cited by examiner

*Primary Examiner*—Ernest F Karlsen
(74) *Attorney, Agent, or Firm*—Hayes Soloway P.C.

(57) ABSTRACT

The ATE system includes a system computer. A plurality of platform computers is in communication with the system computer. A plurality of test instrument boards is provided. Each of the platform computers is in communication with at least one of the test instrument boards. At least one device interface board is provided. Each of the plurality of test instrument boards is in communication with at least one of the device interface boards. At least one device mover is proximate to at least one of the device interface boards for moving devices under testing to at least one of the device interface boards.

16 Claims, 12 Drawing Sheets

SYSTEM AND METHOD FOR UTILIZING AN AUTOMATIC CIRCUIT TESTER SYSTEM HAVING MULTIPLE AUTOMATIC CIRCUIT TESTER PLATFORMS

CROSS-REFERENCE TO RELATED APPLICATION

This application claims priority to co-pending U.S. Provisional Application entitled, "Automatic Circuit Tester System Composed of Multiple Automatic Circuit Tester Platforms and a System Computer" having Ser. No. 60/835,790 filed Aug. 4, 2006, which is entirely incorporated herein by reference.

FIELD OF THE INVENTION

The present invention is in the field of circuit testers and, more specifically, relates to a centrally controlled system of a plurality of automatic test equipment platforms.

BACKGROUND OF THE INVENTION

FIG. 1 is a block diagram of a prior art semiconductor ATE platform 10 architecture. Automatic test equipment platforms 10 ("ATE platforms," "ATE testers," or "testers") are used to test electronic circuit devices (e.g., semiconductor components) during the manufacturing process. A device that is being tested is referred to as a "device under test" ("DUT") 12 or, in the plural, as "devices under test" ("DUTs") 12.

ATE tester 10 architecture includes, among other things, a user computer ("platform computer") 14, one or more test instrument boards 16 (sometimes referred to as "test instruments," for short), a device interface board ("DIB") 18, and a device for moving devices under test 12 to and from the DIB 18, such as a handler or a prober 20. Hereinafter, the term handler/prober 20 will be considered implicitly inclusive of all devices that may be used to move DUTs 12 to and/or from the DIB 18. The platform computer 14 can be a personal computer ("PC") or a workstation. The user interface software and the software that controls the handler/prober 20 for moving the DUTs 12 resides within the platform computer 14.

The DIB 18 is the component of the tester 10 that immediately connects to or contacts the signal receiving and signal outputting elements ("pins") of the DUTs 12. The handler/prober 20 moves the DUTs 12 to the DIB 18 for testing, and off the DIB 18 once testing has concluded. In testers similar to tester 10 that test packaged semiconductor chips, the handler/prober 20 that moves the DUTs 12 to and from the DIB 18 may be referred to simply as a handler, while in testers similar to tester 10 that test pre-packaged semiconductor wafers, the handler/prober 20 that moves the DUTs 12 to and from the DIB 18 may be referred to simply as a prober.

Test instrument boards 16 communicate with the platform computer 14 via a communication board 22, and generate actual test signals that are applied to the pins of the DUTs 12 via the DIB 18, and/or capture the signals returned ("return signals") by the DUTs 12 via the DIB 18. Most testers 10 have dozens of test instrument boards 16. Test instrument boards 16 may contain a test vector sequencer and a DIB interface through which they communicate with the DIB 18. A backplane could be used instead of or in addition to the communication board and some in the industry may consider the backplane to be equivalent to the communication board in some respects.

The test vector sequencer is the component of the test instrument boards 16 that controls the timing of the application of test signals to the DUTs 12, and the capture of return signals from the DUTs 12. A signal applied to one input pin of the DUTs 12 or captured from one output pin of the DUTs 12 is referred to as a "vector." A signal applied to an input pin of the DUTs 12 to test that each of the DUTs 12 operates correctly is hence referred to as a "test vector."

DUTs 12 generally possess multiple input and output pins and some pins can serve both for input and output purposes. DUTs 12 may possess significant internal complexity, such as multiple test vectors that must be applied to multiple input pins in a specific pre-determined sequence to properly test a characteristic, feature, or function, of the DUTs 12. A collection of test vectors for such a test comprises a "test pattern."

Test engineers may write such test patterns using programming languages such as C, VHDL, or Verilog, in accordance with the design and specification of the DUTs 12. Test patterns in programming language form are then compiled into machine-readable binary code test patterns. A test pattern compiler 26, a component of the software that runs on the platform computer 14, performs the compilation. The compiled machine-readable binary code test pattern may then be loaded from the platform computer 14 to each of the test instrument boards 16 before the ATE platform 10 starts the testing of the DUTs 12.

Similarly, once the test has concluded, the collection of vectors captured from the output pins of the DUTs 12 may be transferred from the test instrument boards 16 that captured those vectors to the platform computer 14 for the purposes of test result analysis. When testing DUTs 12 in the context of a manufacturing operation, one priority may be to complete testing of the devices as quickly as possible. Long test times reduce the throughput of the manufacturing process, effectively increasing production costs of each device.

FIG. 2 is the flow chart of a prior art semiconductor device test 70 performed by using the ATE platform 10 shown in FIG. 1. As shown, a test is written in a programming language (block 72). The test is compiled into binary code test patterns using the test pattern compiler 26 on the platform computer 14 (block 74). The binary code test pattern is transferred through the communication board 22 to the test instrument boards 16 (block 76). The handler/prober 20, at the direction of the platform computer 14, puts DUTs 12 on the DIB 18 (block 78). The test pattern is applied through the DIB interface to the DUTs 12 on the DIB 18 (block 80). Test vectors are captured by the test instrument boards 16 and transferred back to the platform computer 14 (block 82). Analysis of the test vectors may then be performed at the platform computer 14 (block 84). The platform computer 14 then causes the handler/prober 20 to remove the tested DUTs 12 from the DIB 18 and sort it according to the analysis results (block 86).

It is not unusual for a plurality of test instrument boards 16 to be utilized in testing one of the DUTs 12. For instance, an ATE tester 10 testing a 50-pin DUT 12 may utilize 5 or more test instrument boards 16, operating concurrently. That ATE tester 10 may be testing a handful of 50-pin DUTs 12 concurrently, utilizing 25 or more test instrument boards 16. However, the more test instrument boards 16 that are used concurrently, the more difficulty the platform computer 14 has compiling test results and the more the communication board 22 may operate to bottleneck the signals transmitted between the various test instrument boards 16 and the platform computer. The architecture for this type of ATE tester 10 is shown in FIG. 3.

ATE tester 10 architecture may rely on a single, stand-alone ATE tester 10, having one platform computer 14 and one or more test instrument boards 16, to perform tests on one DUT 12 or multiple DUTs 12 simultaneously. FIG. 3 is a block diagram of a prior art semiconductor ATE platform 10 architecture utilizing a plurality of test instrument boards 16. Most marketable ATE testers 10 utilize 16-64 test instrument boards. In cases where multiple DUTs 12 are tested in parallel, an ATE tester 10 may include multiple test instrument boards 16, all connected to the single platform computer 14, with different subsets of the test instrument boards 16 dedicated to each DUTs 12 being tested. However, the large number of vectors in some test patterns, the large number of vectors returned by some tests, the large number of tests that can be required to test DUTs 12 satisfactorily, the need to communicate test patterns and captured output vectors to and from the platform computer 14 and test instrument boards 16, and inherent bandwidth limitation of a communications board 22 and connection between the platform computer 14 and the test instrument boards 16 impose a limit on the number of DUTs 12 that can be simultaneously tested by a standalone ATE tester 10 operated by one test engineer ("user"). Operation of the ATE tester 10 would be more efficient and the bandwidth limitations obviated by limiting the number of test instrument boards 16, but limiting the number of test instrument boards 16 directly limits how quickly the ATE tester 10 can functionally test the DUTs 12.

For example, some companies utilize an ATE tester 10 having one platform computer 14 with an 800 Mbps firewire connection to the communications board 22. About 60-70 test instrument boards 16 are attached to the communications board 22. As a result, if one of the test instrument boards 16 communicates to the platform computer 14 through the communications board 22 and firewire, it can communicate at a rate of up to 800 Mbps under ideal conditions. In general, under optimal conditions, only 70-90% efficiency can be achieved because of the physical impedance on the communication board 22 and firewire. However, if 60-70 test instrument boards 16 are trying to connect to the platform computer 14 at the same time, efficiency is dramatically reduced, and the platform computer 14 must do time-division multiplexing communication. Further, it is not unusual for many test instrument boards 16 to need to connect to the platform computer 14 at the same time, making inefficiency in the system common.

FIG. 4 is a block diagram of a prior art ATE system 110, in accordance with an invention disclosed in US Patent Application Publication Number 2003/0062888 to Magliocco, et al. The ATE system 110 includes a system controller 128. A plurality of testers is in communication with the system controller 128. Each tester is contained within an enclosure 150A-N and includes a platform computer 114A-N. Each of the platform computers 114A-N is in communication with a plurality of test instrument boards 116A-N contained within the enclosure 150A-N of the tester. At least one device interface board 118A-N is provided for each tester, although Magliocco, et al. discloses a collective device interface board 118X that is connectable to the plurality of device interface boards 118A-N. Each of the plurality of test instrument boards 116A-N is in communication with at least one device interface board 118A-N mounted on the enclosure 150A-N of its respective tester.

As disclosed by Magliocco, et al., this prior art ATE system 110 is directed toward scaleable testers. Independently operable testers can be interconnected through their enclosures 150A-N allowing them to "enable testing of a DUT having a number of pins greater than can be accommodated on any single tester, or to simultaneously test a large number of smaller DUTs in parallel on different testers." Paragraph 8 of Magliocco, et al. Unfortunately, a plurality of inefficient testers stacked together, while capable of testing a greater quantity of pins concurrently, have the same inefficiency as unstacked testers.

Thus, a heretofore unaddressed need exists in the industry to overcome the aforementioned deficiencies and inadequacies.

SUMMARY OF THE INVENTION

The present invention is based on the realization that networking a plurality of platform computers for an ATE tester allows the reduction of the ratio of test instrument boards to platform computers, thereby significantly improving tester efficiency.

Embodiments of the present invention provide a system and method for utilizing an automatic circuit tester system having multiple automatic circuit tester platforms through a system controller. Briefly described, in architecture, one embodiment of the system, among others, can be implemented as follows. The ATE system includes a system controller. A plurality of platform computers is in communication with the system controller. A plurality of test instrument boards is provided. Each of the platform computers is in communication with at least one of the test instrument boards. At least one device interface board is provided. Each of the plurality of test instrument boards is in communication with at least one of the device interface boards. At least one device mover is proximate to at least one of the device interface boards for moving devices under testing to at least one of the device interface boards.

The present invention can also be viewed as providing methods for utilizing an automatic circuit tester system having multiple automatic circuit tester platforms through a system computer. In this regard, one embodiment of such a method, among others, can be broadly summarized by the following steps: moving a plurality of devices onto a plurality of device interface boards; testing the plurality of devices on at least one device interface board using test instrument boards; controlling the testing with code from a plurality of platform computers; capturing results of the testing with the plurality of platform computers; and compiling the results at a system computer.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, similar reference numerals designate corresponding parts throughout the several views.

DETAILED DESCRIPTION

Figure 5:
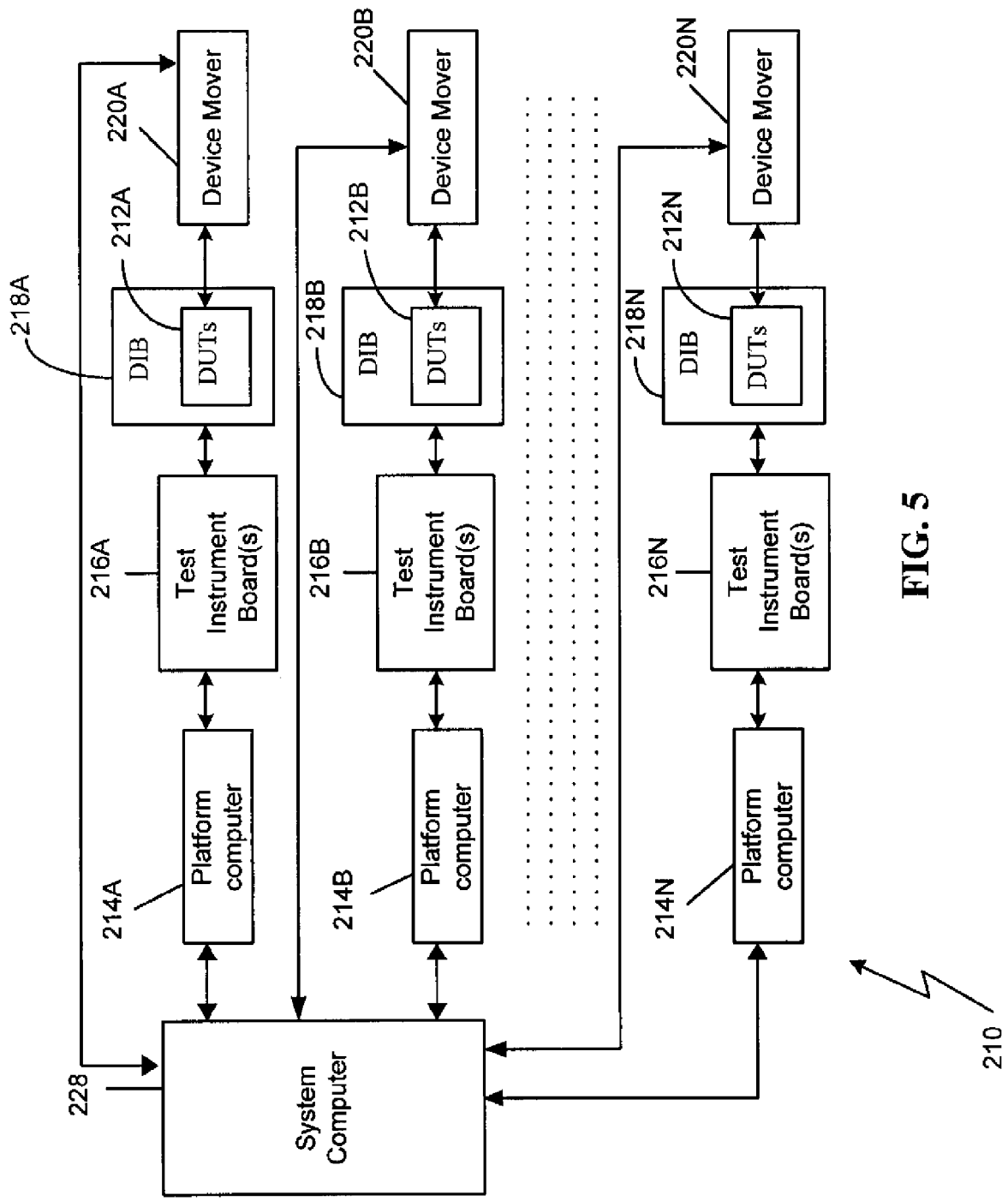
FIG. 5 is a block diagram of an ATE system, in accordance with a first exemplary embodiment of the present invention.

FIG. 5 is a block diagram of an ATE system 210, in accordance with a first exemplary embodiment of the present invention. The ATE system 210 includes a system computer 228. A plurality of platform computers 214A-N is in communication with the system computer 228. A plurality of test instrument boards 216A-N is provided. Each of the platform computers 214A-N is provided with at least one and less than six of the test instrument boards 216A-N in the plurality of test instrument boards 216A-N, wherein each test instrument board 216A-N is in communication with at least one of the platform computers 214A-N. A plurality of device interface boards 218A-N is provided. Each of the plurality of test instrument boards 216A-N is provided with at least one of the device interface boards 218A-N, wherein each of the device interface boards 218A-N is in communication with at least one of the test instrument boards 216A-N. At least one device mover 220A-N is proximate to at least one of the device interface boards 218A-N for moving devices under testing 212A-N to at least one of the device interface boards 218A-N. The device movers 220A-N are controlled by the system computer 228.

The system computer 228 may be a special or general-purpose digital computer, such as a personal computer (PC; IBM-compatible, Apple-compatible, or otherwise), workstation, minicomputer, or mainframe computer. The platform computers 214A-N may be special or general purpose digital computers, such as personal computers, workstations, mini-computers, or mainframes. Each computer disclosed herein shall contain, at a minimum, a processor or its functional equivalent. More specifically, the platform computers 214A-N may be little more than a semiconductor chip having a processor. The processor is a hardware device for executing software. The processor can be any custom made or commercially available processor, a central processing unit (CPU), an auxiliary processor among several processors associated with the computer, a semiconductor based microprocessor (in the form of a microchip or chip set), a macroprocessor, or generally any device for executing software instructions. While a system computer 228 is shown in FIG. 5, those having ordinary skill in the art will recognize the system computer 228 could be replaced with a more mechanical system controller and monitor, allowing the platform computers 214A-N to perform substantially all the computing, although such a controller would decrease the efficiency of the ATE system 210.

As shown in FIG. 5, each platform computer 214A-N is in communication with the system computer 228. That communication may be wired or wireless communication and those having ordinary skill in the art will recognize various means exist for communicating between each platform computer 214A-N and the system computer 228. In the first exemplary embodiment, user interface tasks are delegated to the system computer 228, control of the device mover 220A-N for moving DUTs 212A-N to and from the DIB 218A-N, and synchronization between the operation of the test instrument boards 216A-N and the operation of the device movers 220A-N, while the platform computers 214A-N handle test vector compilation and test result collection.

Each test instrument board 216A-N is in communication with at least one of the platform computers 214A-N. That communication may be wired or wireless communication and those having ordinary skill in the art will recognize various means exist for communicating between each platform computer 214A-N and test instrument board 216A-N. Each of the test instrument board 216A-N generates test signals that are applied to the pins of the DUTs 212A-N via the DIBs 218A-N, and/or capture the signals returned ("return signals") by the DUTs 212A-N via the DIBs 218A-N. Test instrument boards 216A-N may contain a test vector sequencer and a DIB interface through which they communicate with the DIBs 218A-N. One platform computer 214A may support multiple test instrument boards 216A and one DIB 218A may support multiple DUTs 212A.

As shown in FIG. 5, much of the operation of the ATE system 210 from the platform computers 214A-N to the DIBs 218A-N and the device movers 220A-N may be similar to known ATE system 10. However, by limiting the number of test instrument boards 216A-N connected to each platform computer 214A-N to less than six test instrument boards 216A-N and by removing the communication board, the platform computers 214A-N can operate at closer to 100% efficiency. Communication boards are useful in situations where a tester has 16-64 test instrument boards per platform computer, as described in the background. However, by reducing the ratio of test instrument boards 216A-N to platform computers 214A-N, as in the present invention, the need for communication boards can be obviated. Further, by replacing communication boards with other types of communication means, as disclosed herein, an impedance to efficiency is removed from the ATE system 210. Also, the system computer 228 and the platform computers 214A-N may communicate as necessary to synchronize the operation of test instrument boards 216A-N and the operation of the device movers 220A-N.

Figure 6:
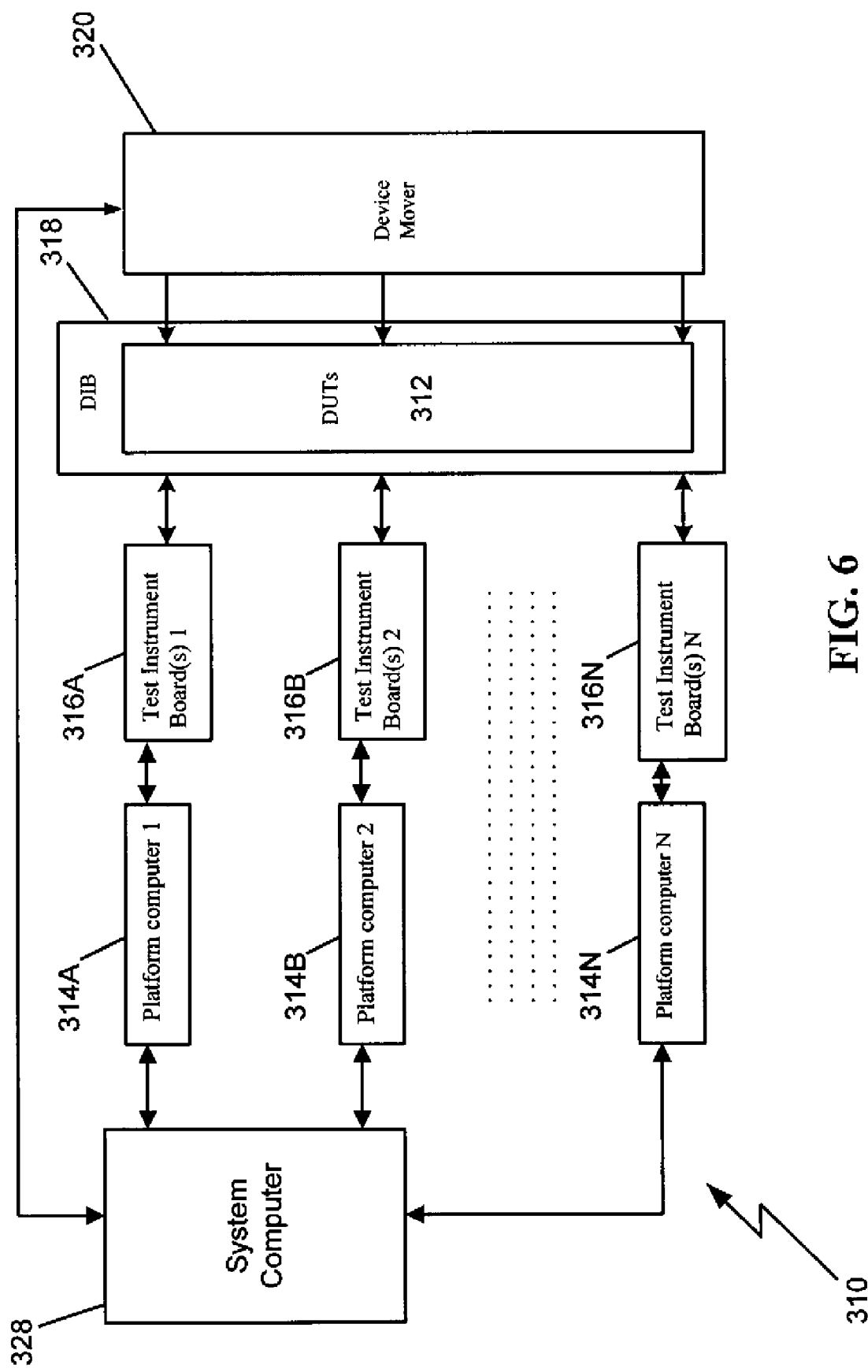
FIG. 6 is a block diagram of an ATE system, in accordance with a second exemplary embodiment of the present invention.

FIG. 6 is a block diagram of an ATE system 310, in accordance with a second exemplary embodiment of the present invention. The ATE system 310 includes a system computer 328. A plurality of platform computers 314A-N is in communication with the system computer 328. A plurality of test instrument boards 316A-N is provided. Each of the platform computers 314A-N is in communication with at least one of the test instrument boards 316A-N in the plurality of test instrument boards 316A-N. A device interface board 318 is provided. Each of the plurality of test instrument boards 316A-N is in communication with the device interface board 318. At least one device mover 320 is proximate to the device interface board 318 for moving devices under testing 312 to the device interface board 318. The system computer 328 controls the device mover 320.

As shown in FIG. 6, as compared to FIG. 5, rather than having the system with multiple DIBs 218A-N, one DIB 318 for the entire system may be capable of accommodating or serving multiple DUTs 312 concurrently could be used. Likewise, instead of providing the system with device movers 220A-N, one device mover 320 for entire the ATE system 310 capable of accommodating or serving multiple DUTs 312 simultaneously could be used. The system computer 328 and the platform computers 314A-N may communicate as necessary to synchronize the operation of test instrument boards 316A-N and the operation of the device mover 320.

Figure 7:
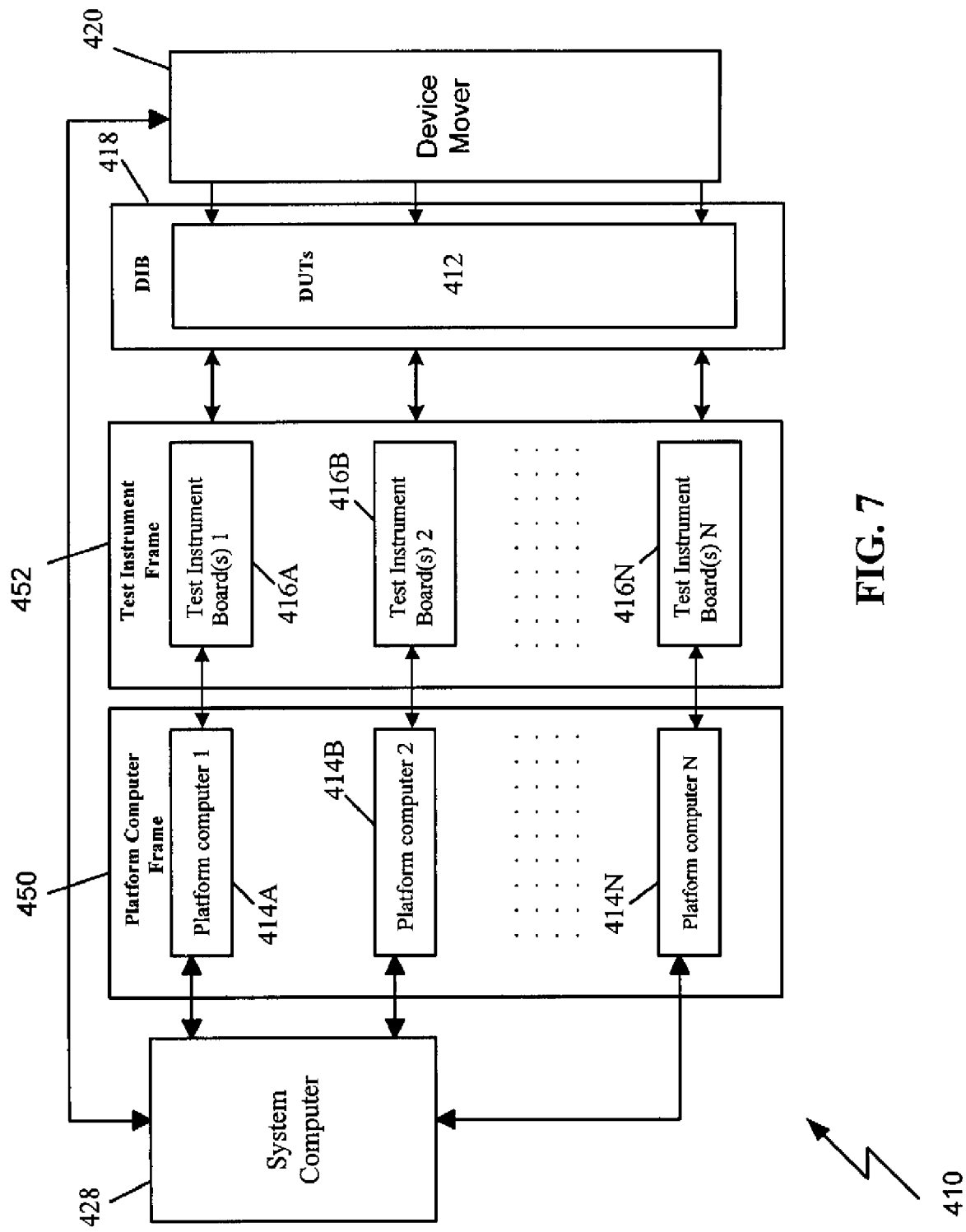
FIG. 7 is a block diagram of an ATE system, in accordance with a third exemplary embodiment of the present invention.

FIG. 7 is a block diagram of an ATE system 410, in accordance with a third exemplary embodiment of the present invention. The ATE system 410 includes a system computer 428. A plurality of platform computers 414A-N is in communication with the system computer 428. The plurality of platform computers 414A-N is stored within a platform computer frame 450. A plurality of test instrument boards 416A-N is provided. Each of the platform computers 414A-N is in communication with at least one of the test instrument boards 416A-N in the plurality of test instrument boards 416A-N. The plurality of test instrument boards 416A-N is stored within a test instrument frame 452. A device interface board 418 is provided. Each of the plurality of test instrument boards 416A-N is in communication with the device interface board 418. At least one device mover 420 is proximate to the device interface board 418 for moving devices under testing 412 to the device interface board 418. The system computer 428 controls the device mover 420.

Figure 1:
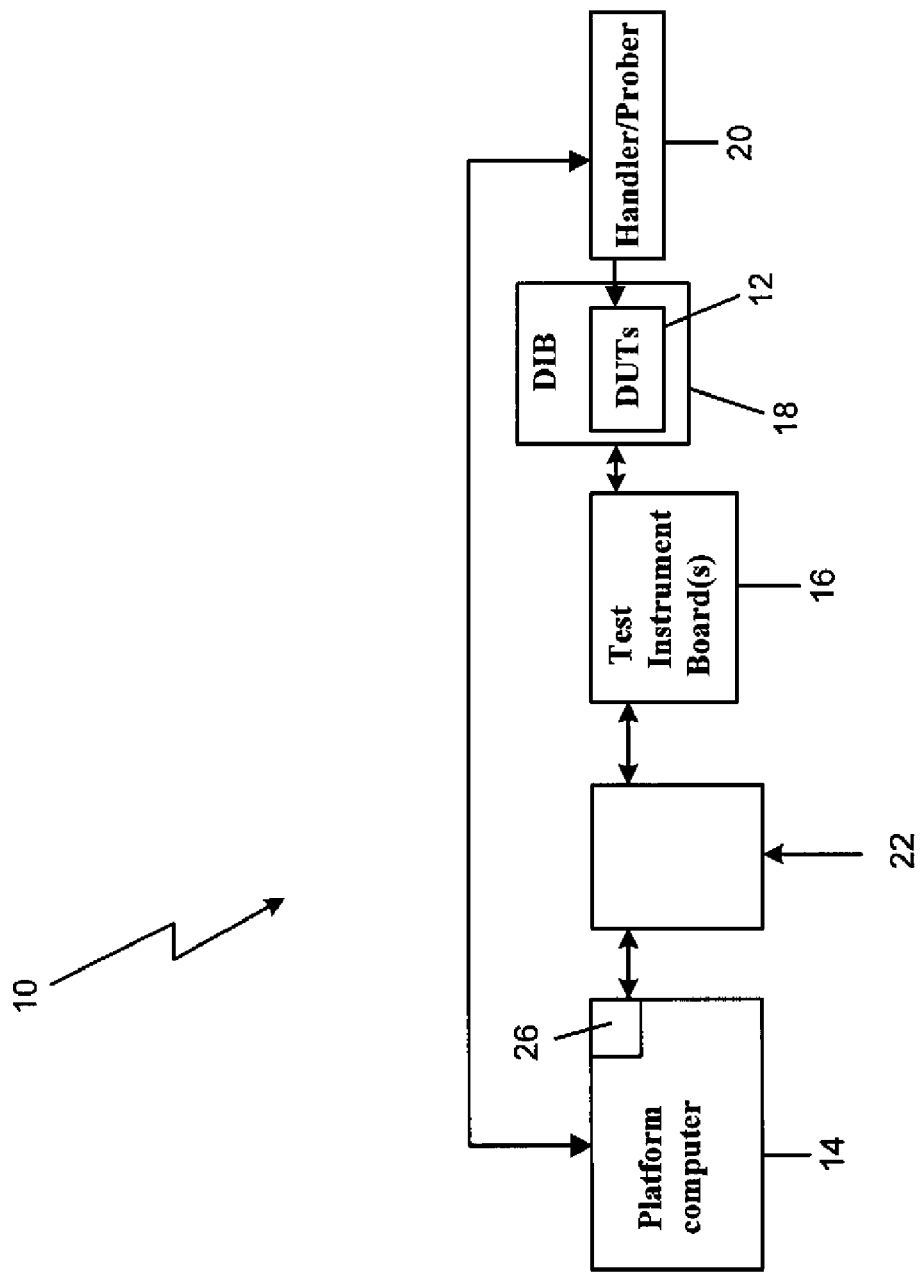
FIG. 1 is a block diagram of a prior art semiconductor ATE platform architecture.
Figure 2:
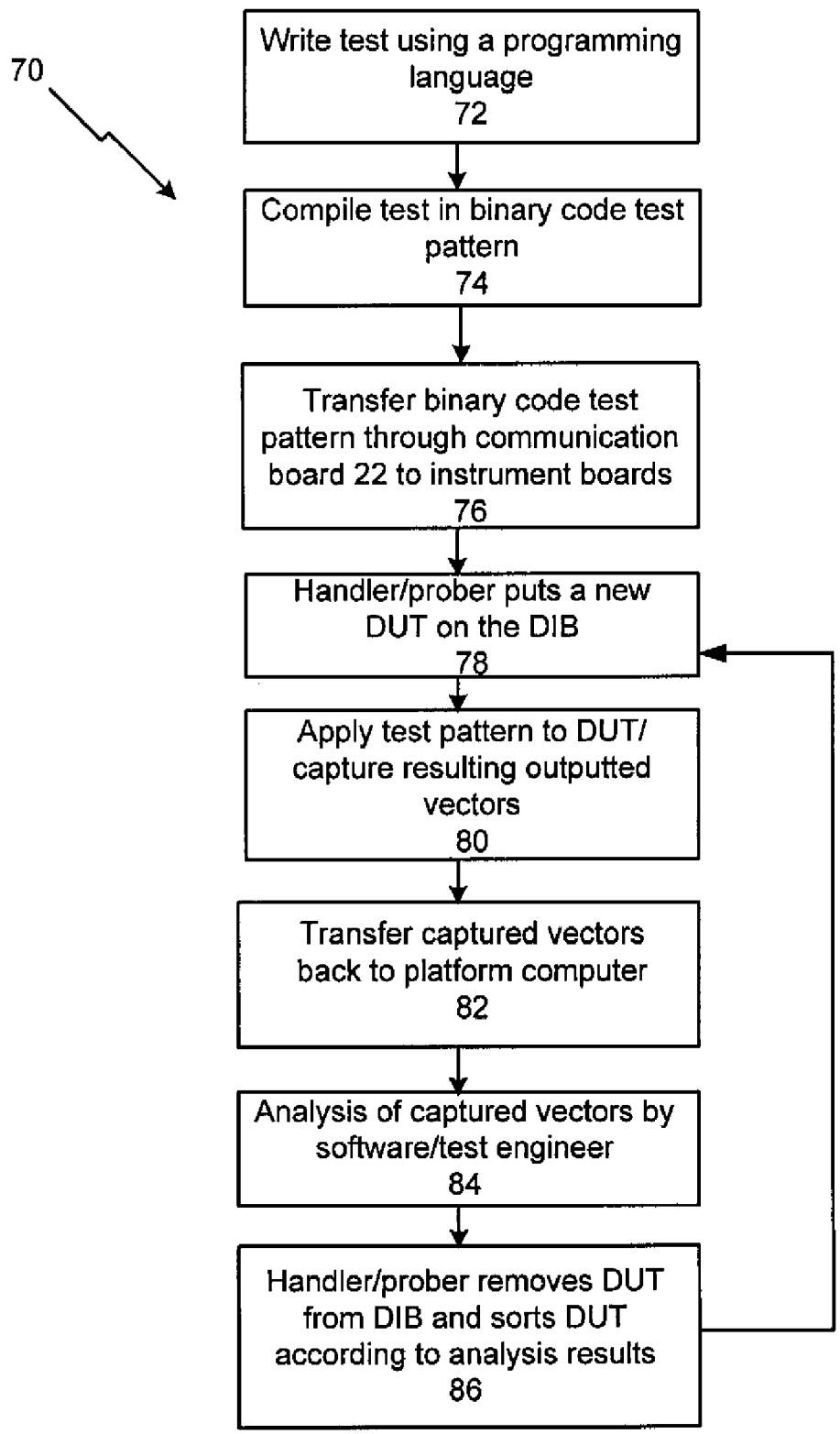
FIG. 2 is the flow chart of a semiconductor device test performed by using the ATE platform shown in FIG. 1.
Figure 3:
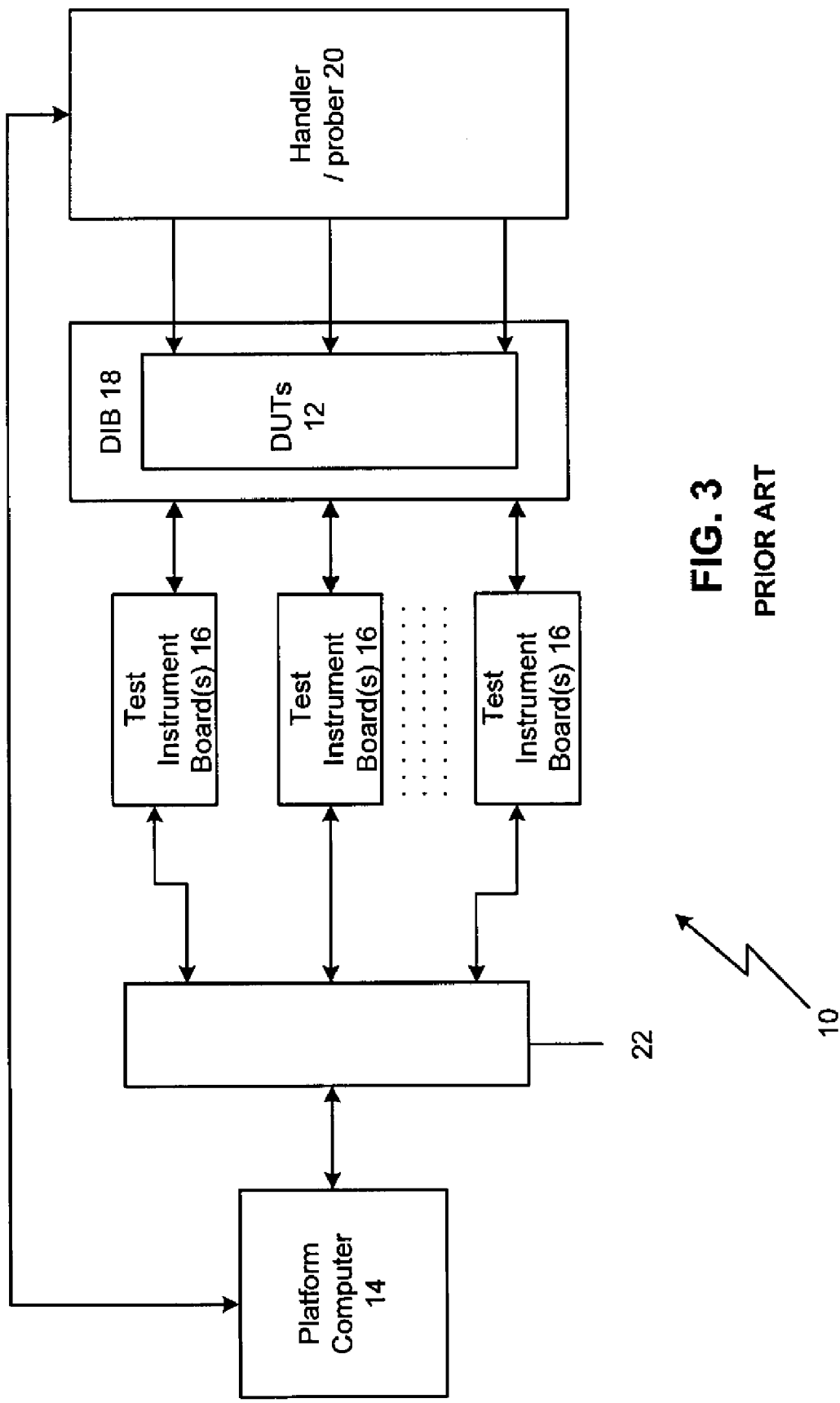
FIG. 3 is a block diagram of a prior art semiconductor ATE platform architecture utilizing a plurality of test instrument boards.
Figure 4:
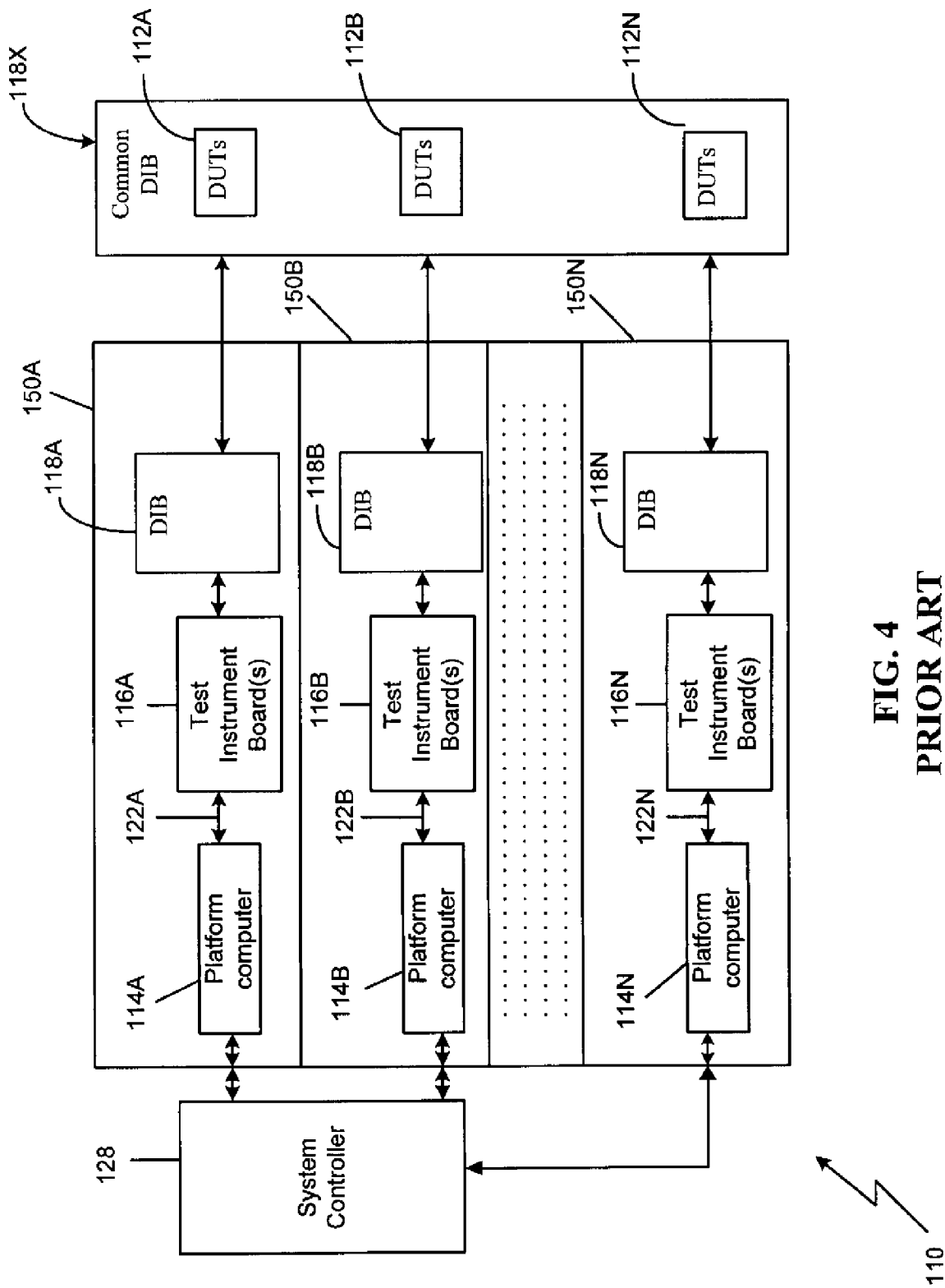
FIG. 4 is a block diagram of a prior art ATE system 110, in accordance with an invention disclosed in US Patent Application Publication Number 2003/0062888 to Magliocco, et al.

As shown in FIG. 7, the platform computers 414A-N are stored within the platform computer frame 450. The platform computers 414A-N may operate as simplified computers, having minimal need for I/O devices, which helps to make storage within the platform computer frame 450 feasible. The test instrument boards 416A-N are stored within the test instrument frame 452. As can be seen in comparing FIG. 7 to FIG. 4, use of a singular DIB 418 and a singular device mover 420 as well as use of the platform computer frame 450 and the test instrument frame 452 helps to turn a sprawling system of stacked individual testers into a spatially efficient ATE system 410 with a less invasive footprint.

Figure 8:
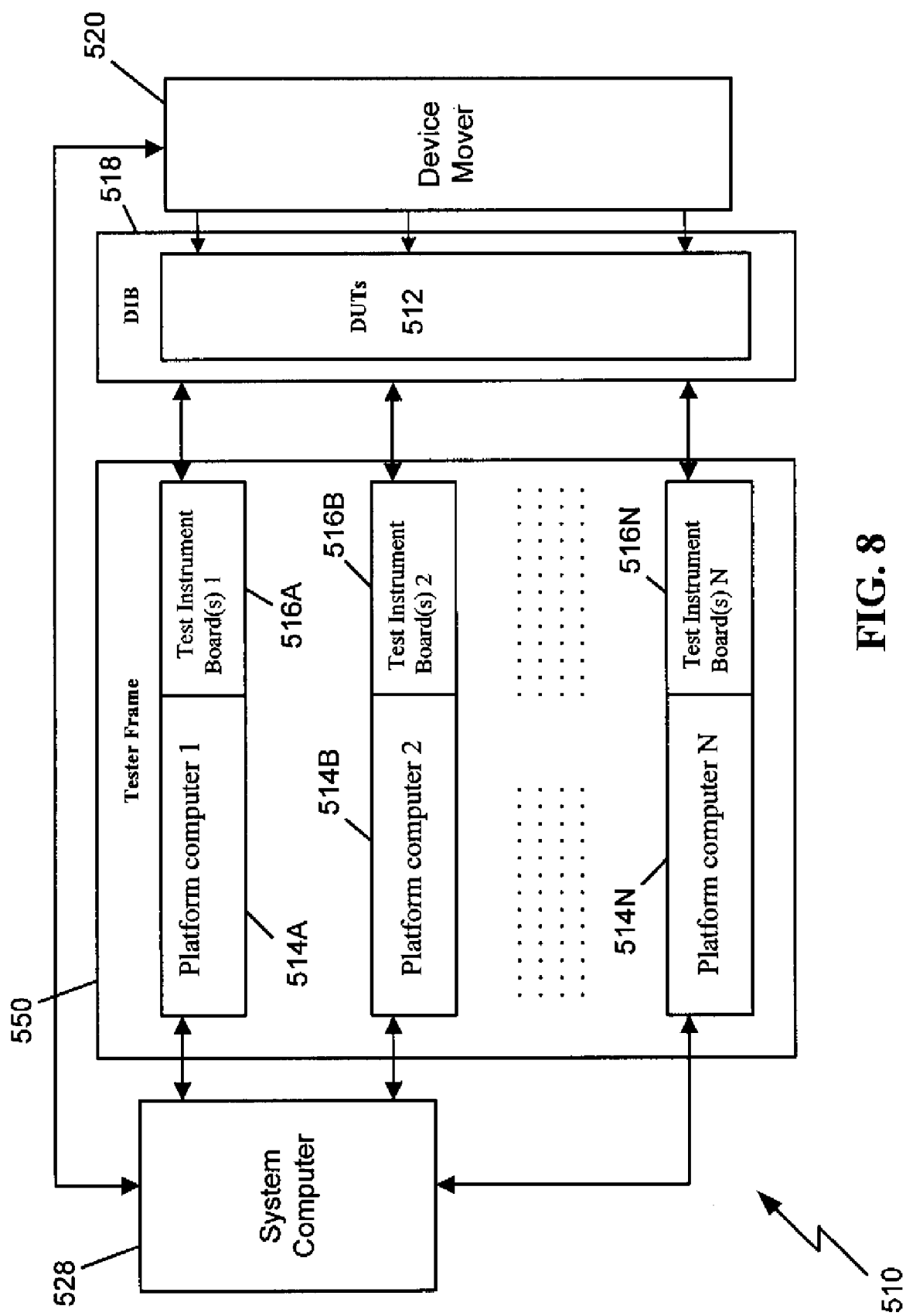
FIG. 8 is a block diagram of an ATE system, in accordance with a fourth exemplary embodiment of the present invention.

FIG. 8 is a block diagram of an ATE system 510, in accordance with a fourth exemplary embodiment of the present invention. The ATE system 510 includes a system computer 528. A plurality of platform computers 514A-N is in communication with the system computer 528. A plurality of test instrument boards 516A-N is provided. Each of the platform computers 514A-N is connected to at least one of the test instrument boards 516A-N in the plurality of test instrument boards 516A-N. The plurality of platform computers 514A-N and the plurality of test instrument boards 516A-N are stored within a tester frame 550. A device interface board 518 is provided. Each of the plurality of test instrument boards 516A-N is in communication with the device interface board 518. At least one device mover 520 is proximate to the device interface board 518 for moving DUTs 512 to the DIB 518. The system computer 528 controls the device mover 520.

As shown in FIG. 8, the plurality of platform computers 514A-N and the plurality of test instrument boards 516A-N are stored within a tester frame 550. The platform computers 514A-N may operate as simplified computers, having minimal need for I/O devices, which helps to make storage within the tester frame 550 feasible. Storing the plurality of platform computers 514A-N and the plurality of test instrument boards 516A-N within a single tester frame 550 may make connections between the devices easier and make arrangement of the ATE system 510 spatially efficient. Alternatively, within this embodiment, each platform computer 514A-N may be merged with at least one test instrument board 516A-N, forming a plurality of tester agglomerates that can be stored within the tester frame 550. Therefore, each of the tester agglomerates has the functionality of a platform computer 514A-N and at least one test instrument board 516A-N.

Figure 9:
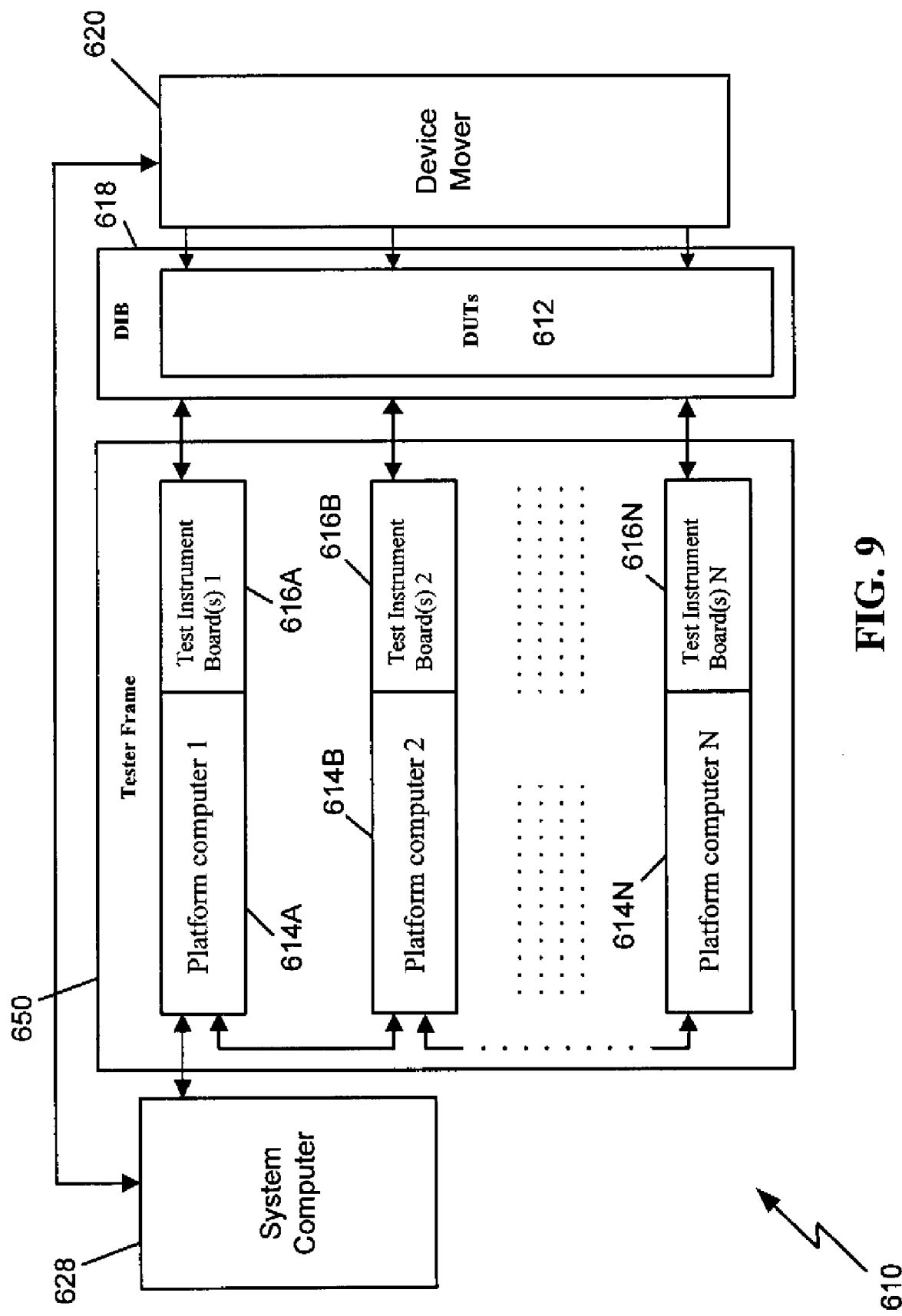
FIG. 9 is a block diagram of an ATE system, in accordance with a fifth exemplary embodiment of the present invention.

FIG. 9 is a block diagram of an ATE system 610, in accordance with a fifth exemplary embodiment of the present invention. The ATE system 610 includes a system computer 628. A plurality of platform computers 614A-N is in communication with the system computer 628. The plurality of platform computers 614A-N are arranged in series, such that the system computer 628 is in communication with a first platform computer 614A, which is in communication with a second platform computer 614B, and so on, to an Nth platform computer 614N. A plurality of test instrument boards 616A-N is provided. Each of the platform computers 614A-N is connected to at least one of the test instrument boards 616A-N in the plurality of test instrument boards 616A-N. The plurality of platform computers 614A-N and the plurality of test instrument boards 616A-N are stored within a tester frame 650. A device interface board 618 is provided. Each of the plurality of test instrument boards 616A-N is in communication with the device interface board 618. At least one device mover 620 is proximate to the device interface board 618 for moving DUTs 612 to the DIB 618. The system computer 628 controls the device mover 620.

As shown in FIG. 9, a plurality of platform computers 614A-N is arranged in series, such that the system computer 628 is in communication with a first platform computer 614A, which is in communication with a second platform computer 614B, and so on, to an Nth platform computer 614N (a "daisy chain"). Thus, every platform computer 614A-N in the chain is connected to two computers 628, 614A-N, except for the Nth platform computer 614N in the chain, which is connected to only one platform computer 614(N−1) (not shown). Through this series communication, the system computer 628 remains in communication with all of the platform computers 614A-N. If wired, this daisy-chain connection will significantly reduce wiring requirements for the ATE system 610.

One having ordinary skill in the art will recognize that the above explicitly described exemplary embodiments can be mixed and interconnected to create other embodiments. These other embodiments are implicitly disclosed, are readily understood to one having ordinary skill in the art, and are considered to be within the scope of the present invention.

Returning to FIG. 7, which discloses the third exemplary embodiment, one of the advantages of the present invention is understood by reducing the ratio of test instrument boards 416A-N to platform computers 414A-N. The ATE tester 410 will operate more efficiently with less than ten test instrument boards 416A-N per platform computer 414A-N, on average through the ATE tester 410. The ATE tester 410 may operate with further efficiency with less than five test instrument boards 416A-N per platform computer 414A-N, on average through the ATE tester 410. In some cases, it may be preferable to have one test instrument board 416A-N per platform computer 414A-N.

According to this invention, a novel ATE system architecture is disclosed that permits a larger numbers of electronic circuits, such as semiconductor components, to be more easily, and conveniently, tested in parallel than with the state of the prior art.

Figure 10:
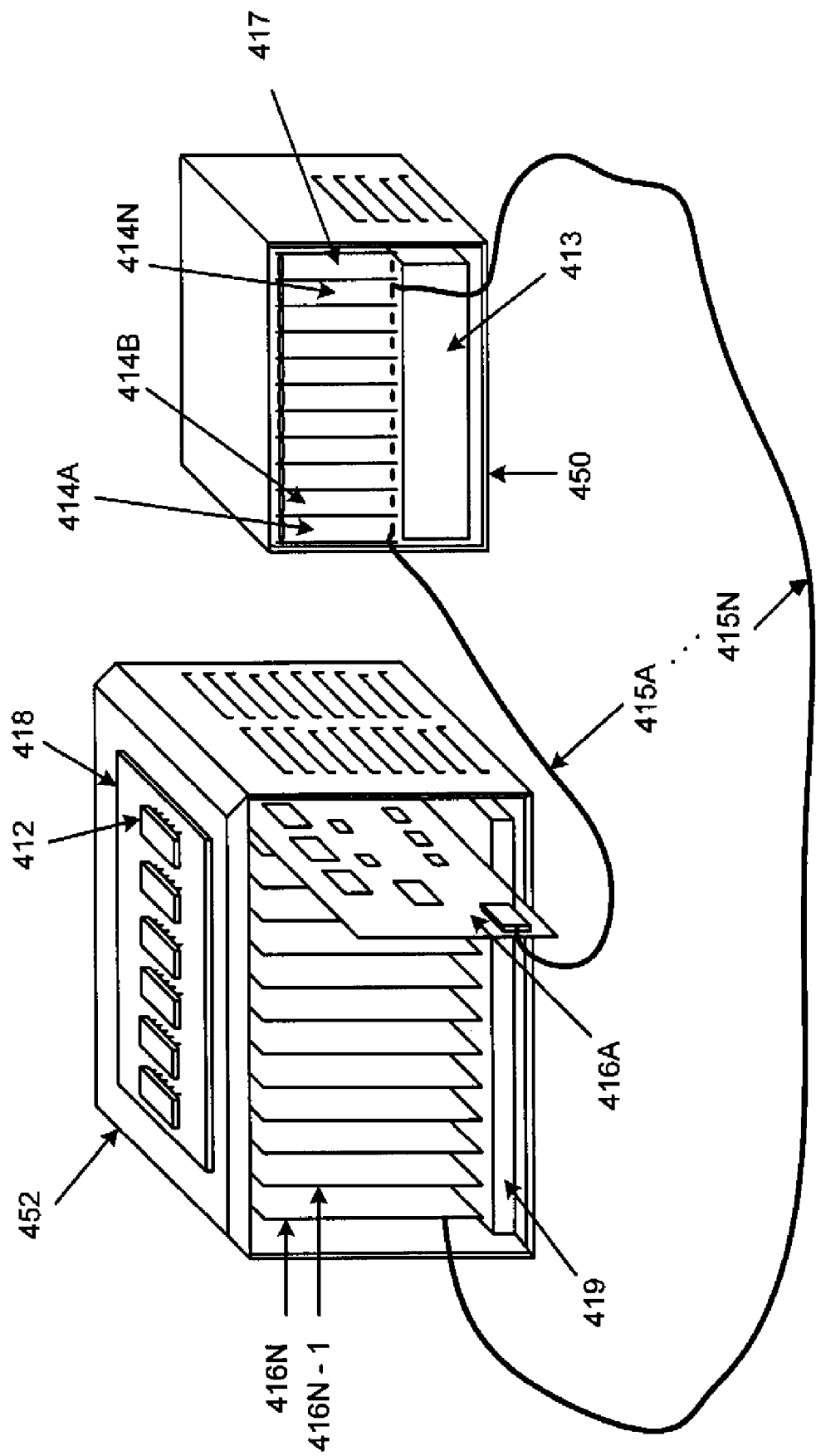
FIG. 10 is one conceptualization of a portion of the ATE system of FIG. 7, in accordance with the third exemplary embodiment of the present invention.

FIG. 10 is one conceptualization of a portion of the ATE system 410 of FIG. 7, in accordance with the third exemplary embodiment of the present invention. FIG. 10 shows a plurality of platform computers 414A-N stored in a platform computer frame 450. The platform computers 414A-N are connected to a plurality of test instrument boards 416A-N using USB cables 415A-N. Each platform computer 414A-N is connected to at least one test instrument boards 416A-N by a USB cable 415A-N, or similar communication mechanism. The test instrument boards 416A-N are mounted within the test instrument frame 452. The test instrument boards 416A-N are in communication with a DIB 418 having a plurality of DUTs 412, which are mounted on the test instrument frame 452.

The platform computer frame 450 may also contain a power supply 413 for the platform computers 414A-N. A reference clock generator 417 may also be provided in the ATE system 410 and may be included in the platform computer frame 450. The test instrument frame 452 may include a cooling device 419 to keep the test instrument frame 452 at a functional temperature.

Figure 11:
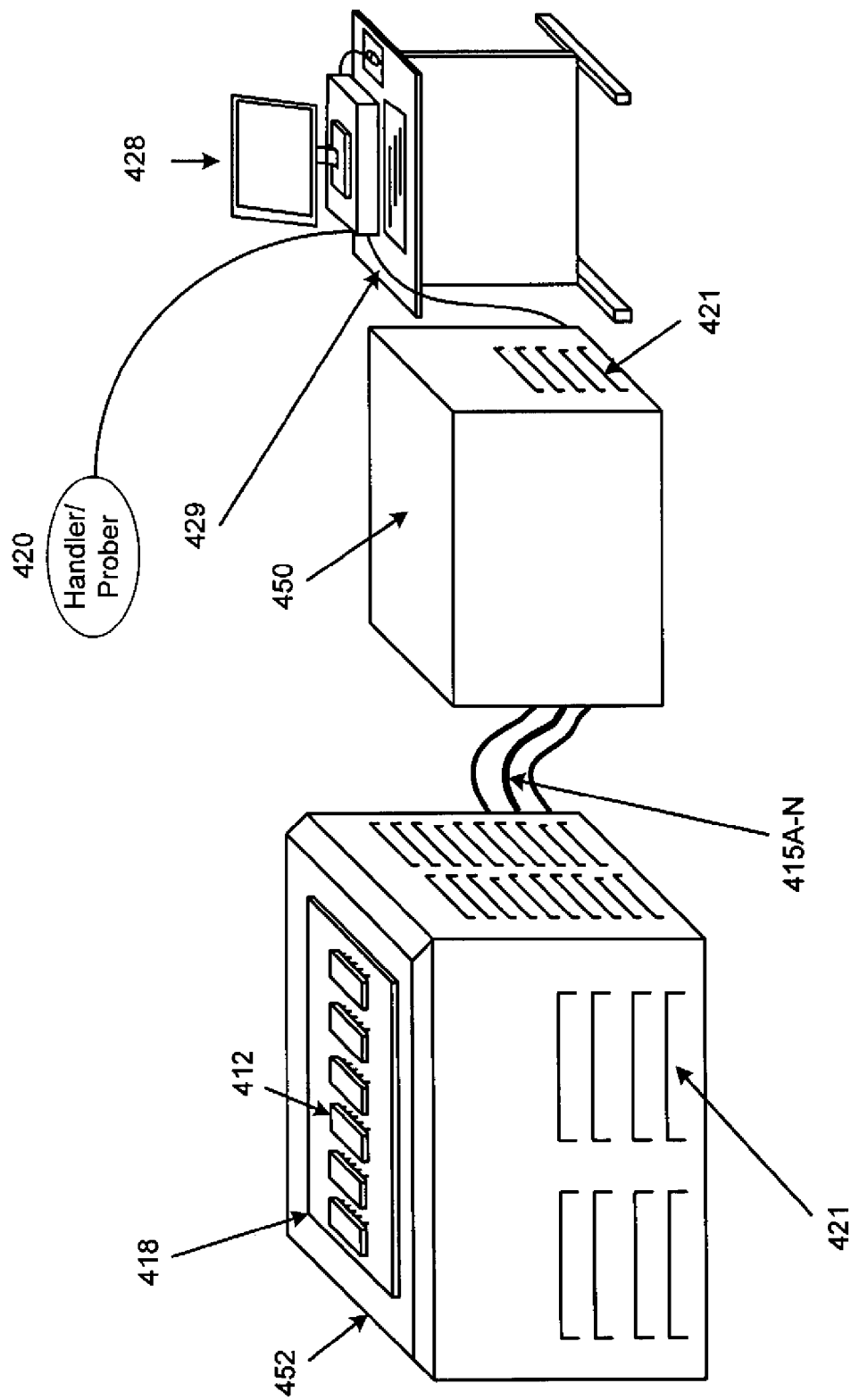
FIG. 11 is a further conceptualization of the ATE system of FIG. 10, in accordance with the third exemplary embodiment of the present invention.

FIG. 11 is a further conceptualization of the ATE system 410 of FIG. 10, in accordance with the third exemplary embodiment of the present invention. FIG. 11 shows the system computer 428 in a simple desktop arrangement. The system computer 428 may, for instance, connect to the platform computers 414A-N through a gigabit Ethernet (system cable 429). The system computer 428 is shown with a system cable 429 running into the platform computer frame 450, where the platform computers 414A-N may be stored, USB cables 415A-N are shown running between the platform computer frame 450 and the test instrument frame 452 connecting the platform computers 414A-N and the test instrument boards 416A-N. A power supply 413 and a reference clock generator 417 may also be stored in the platform computer frame 450, communicating with elements stored in the platform computer frame 450 by cable. The test instrument boards 416A-N are in communication with a DIB 418 having a plurality of DUTs 412, which are mounted on the test instrument frame 452. Air vents 421 are shown in the platform computer frame 450 and the test instrument frame 452 to keep the platform computer frame 450 and the test instrument frame 452 at a functional temperature.

Figure 12:
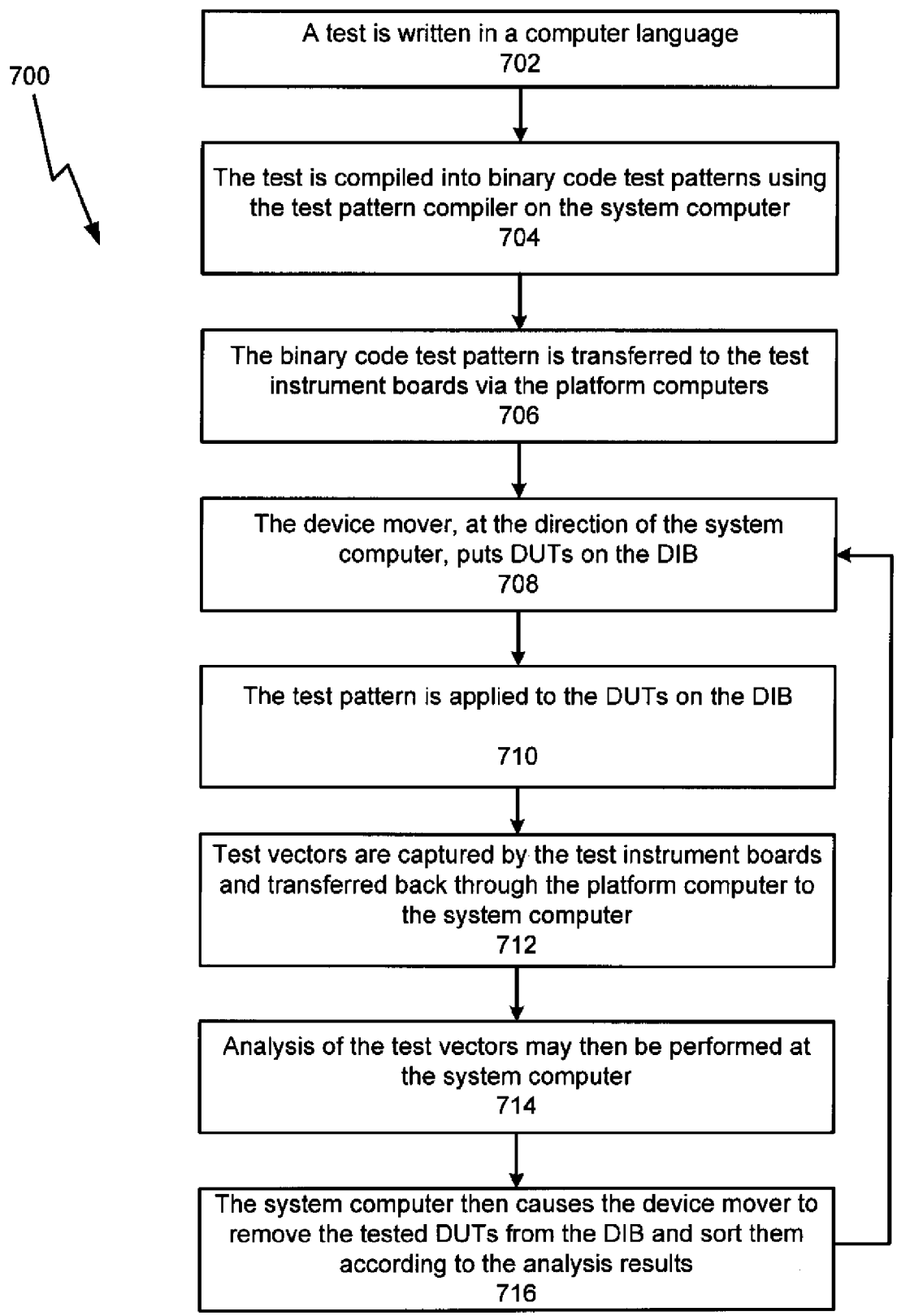
FIG. 12 is a flowchart illustrating a method for utilizing an automatic circuit tester system having multiple automatic circuit tester platforms, in accordance with the third exemplary embodiment of the invention shown in FIG. 7.

FIG. 12 is a flowchart 700 illustrating a method for utilizing an automatic circuit tester system 410 having multiple automatic circuit tester platforms, in accordance with the third exemplary embodiment of the invention shown in FIG. 7. It should be noted that any process description or block in flow charts should be understood as representing modules, segments, portions of code, or steps that include one or more instructions for implementing specific logical functions in the process, and alternate implementations are included within the scope of the present invention in which functions may be executed out of order from that shown or discussed, including substantially concurrently or in reverse order, depending on the functionality involved, as would be understood by those reasonably skilled in the art of the present invention.

As shown in FIG. 12, a test is written in a computer language (block 702). The test is compiled into binary code test patterns using the test pattern compiler on the system computer 428 (block 704). The binary code test pattern is transferred to the test instrument boards 416A-N via the platform computers 414A-N (block 706). The device mover 420, at the direction of the system computer 428, puts DUTs 412 on the DIB 418 (block 708). The test pattern is applied to the DUTs 412 on the DIB 418 (block 710). Test vectors are captured by the test instrument boards 416A-N and transferred back to the platform computers 414A-N (block 712). Analysis of the test vectors may then be performed at the platform computers 414A-N and analysis results are transferred to the system computer 428 (block 714). The system computer 428 then causes the device mover 420 to remove the tested DUTs 412 from the DIB 418 and sort them according to the analysis results (block 716).

The ATE tester 410, as used in FIG. 12, is capable of being more efficient than prior art tester 10. By coordinating a series of platform computers 414A-N, less test instrument boards 416A-N need to be connected to each platform computer 414A-N. In turn, the test instrument boards 416A-N are able to communicate with the platform computers 414A-N more efficiently due to the lack of a bottleneck of communication therebetween. Fifty or more test instrument boards 416A-N can communicate more efficiently with ten, twenty, or fifty platform computers 414A-N than they can with only one platform computer 414A. Also, having only one DIB 418 allows the test instrument boards 416A-N to operate more collaboratively than with a plurality of DIBs connected to a limited number of the test instrument boards.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. An automatic circuit testing system, comprising:
a system controller;
a plurality of platform computers, each platform computer in communication with the system controller;
a plurality of test instrument boards, wherein each of the platform computers is in communication with at least one and less than six of the test instrument boards;
at least one device interface board, wherein each of the plurality of test instrument boards is in communication with at least one device interface board; and
at least one device mover for moving devices under testing to at least one of the device interface boards, wherein the device mover is proximate to at least one of the device interface boards.

2. The automatic circuit testing system of claim 1, wherein the system controller further comprises a system computer further comprising software contained within the system computer for controlling the plurality of platform computers.

3. The automatic circuit testing system of claim 1, wherein the at least one device mover is in communication with the system controller.

4. The automatic circuit testing system of claim 1, further comprising a platform computer frame housing the plurality of platform computers.

5. The automatic circuit testing system of claim 1, further comprising a tester frame housing the plurality of platform computers and the plurality of test instrument boards.

6. The automatic circuit testing system of claim 1, further comprising a daisy chain connection between the plurality of platform computers, wherein only one of the platform computers is in direct communication with the system controller, whereby a remainder of the platform computers is in communication with the system controller.

7. The automatic circuit testing system of claim 1, wherein each of the plurality of platform computers is merged with at least one of the test instrument boards within a single device housing.

8. The automatic circuit testing system of claim 1, wherein the at least one device mover for moving devices under testing consists of one device mover for moving devices under testing.

9. The automatic circuit testing system of claim 1, wherein the at least one device interface board consists of one device interface board.

10. The automatic circuit testing system of claim 1, wherein each of the plurality of platform computers is in communication with at least two of the test instrument boards.

11. The automatic circuit testing system of claim 1, wherein each of the platform computers, on average, are in communication with no more than five of the test instrument boards.

12. The automatic circuit testing system of claim 1, wherein each of the platform computers is in communication with only one of the test instrument boards.

13. An automatic circuit testing system, comprising:
a system computer;
a plurality of platform computers, each platform computer in communication with the system computer;
a plurality of test instrument boards, wherein each of the platform computers is in communication with at least one of the test instrument boards;
at least one device interface board, each of the plurality of test instrument boards in communication with at least one device interface board;
at least one device mover for moving devices under testing to at least one of the device interface boards, wherein the device mover is proximate to at least one of the device interface boards; and
a platform computer frame housing the plurality of platform computers.

14. The automatic circuit testing system of claim 13, wherein each of the platform computers, on average, are in communication with no more than five of the test instrument boards.

15. The automatic circuit testing system of claim 13, wherein each of the platform computers is in communication with only one of the test instrument boards.

16. The automatic circuit testing system of claim 13, wherein the at least one device interface board consists of one device interface board.

* * * * *